US006643184B2

(12) United States Patent
Pio

(10) Patent No.: US 6,643,184 B2
(45) Date of Patent: Nov. 4, 2003

(54) METHOD OF ERASING A FLASH MEMORY

(75) Inventor: Federico Pio, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/057,767

(22) Filed: Jan. 24, 2002

(65) Prior Publication Data
US 2002/0114193 A1 Aug. 22, 2002

(30) Foreign Application Priority Data
Feb. 5, 2001 (EP) .............................. 01830067

(51) Int. Cl.⁷ ................................. G11C 16/04
(52) U.S. Cl. ..................... 365/185.29; 365/185.3
(58) Field of Search .................... 365/185.29, 185.3, 365/185.18, 185.23, 185.19

(56) References Cited
U.S. PATENT DOCUMENTS
5,617,359 A    4/1997  Ninomiya
6,091,642 A  *  7/2000  Pasotti et al. .......... 365/185.29
6,480,419 B2 * 11/2002  Lee ....................... 365/185.18
6,567,316 B1 *  5/2003  Ohba et al. .............. 365/185.3

FOREIGN PATENT DOCUMENTS
WO    WO 00/68952 A1    11/2000

OTHER PUBLICATIONS
European Search Report from European patent application No. 01830067 filed Feb. 5, 2001.

* cited by examiner

Primary Examiner—Anh Phung
(74) Attorney, Agent, or Firm—Lisa K. Jorgenson; Allen, Dyer, Doppelt, Milbrath & Gilchrist, P.A.

(57) ABSTRACT

A method of erasing a flash memory integrated in a chip of semiconductor material and including at least one matrix of cells with a plurality of rows and a plurality of columns made in at least one insulated body, the cells of each row being connected to a corresponding word line; the method includes the step of applying a single erasing pulse relative to a selected single one of the at least one body to a selected subset of the word lines for erasing the cells of each corresponding row made in the selected body with no intermediate check of the completion of the erasure.

22 Claims, 7 Drawing Sheets

METHOD OF ERASING A FLASH MEMORY

FIELD OF THE INVENTION

The present invention relates generally to the field of semiconductor memory devices, and, more particularly, to non-volatile, electrically erasable memories such as flash memories.

BACKGROUND OF THE INVENTION

A flash memory is a particular type of $E^2PROM$ (Electrical Erasable Programmable Read-Only Memory) that is erased in blocks instead of one byte at a time (typically in-system, without requiring any special power supply voltage). This results in a very simple structure of the flash memory, which can be manufactured at low cost and with high density. As a consequence, the flash memory is well suited to a number of end-product applications, such as PCs (Personal Computers), cellular phones, automotive devices, digital still cameras, and the like.

The flash memory is integrated in a chip of semiconductor material and includes one or more sectors, each one formed in a respective insulated well (body). The sector comprises a matrix of memory cells with a plurality of rows and columns; the memory cells of each row are connected to a respective word line, while the memory cells of each column are connected to a respective bit line. Typically, each memory cell consists of a MOS transistor with a floating gate (insulated by means of a thin oxide layer).

A not-programmed transistor has a low threshold voltage; therefore, when the transistor is selected, a current flows through the respective bit line (corresponding to a logic value 1). The transistor is programmed by injecting an electric charge into its floating gate. In this condition, the transistor has a high threshold voltage; therefore, when the transistor is selected, no current flows through the respective bit line (corresponding to a logic value 0).

The flash memory is erased by selecting and discharging all the transistors of a sector at the same time. Particularly, the transistors are at first pre-programmed to the logic value 0; in this way, all the transistors undergo the same programming and erasing cycles during the life of the flash memory, so that a uniform degradation of the transistors with time is ensured. The transistors are then erased by applying a series of erasing pulses with an increasing value, each one followed by a check of the condition of the transistors; the loop is terminated as soon as all the transistors are erased.

The above-described loop of erasing pulses reduces the number of transistors that are over-erased, and therefore feature a negative threshold voltage (depleted transistors). The depleted transistors are conductive even if they are not selected, so that a current flows through the respective bit line; this may cause a malfunctioning of the flash memory (reading of a false logic value 1 for a selected transistor belonging to a bit line with depleted transistors). Therefore, the depleted transistors are identified and restored to a not-depleted condition by a (soft) programming operation, which raises the threshold voltage of the depleted transistors while maintaining their logic value 1.

A drawback of methods known in the art for erasing the flash memory is that they are quite complex. Particularly, the reading operations (for checking if all the transistors have been erased) cause a high power consumption; this drawback is particularly acute when the flash memory is embodied in a battery-supplied portable device in a contact-less application. Moreover, the repeated checks of the sector and the corresponding loading/unloading of the bit lines and word lines at each switching between an erasing pulse and a reading operation makes the erasing procedure very slow.

The series of erasing pulses of increasing value requires a corresponding number of internal voltages, which must be controlled with accuracy; this affects the structure of the flash memory.

A further drawback is that the electric field applied to the oxide layer of the transistors during each erasing pulse is not constant (in the sense of the erasing pulse being steady while the charge in the floating gate decreases), so a less than optimal operation of the transistors is obtained. On the other hand, it is not possible to envisage a finer resolution of the erasing pulses, because it would require a huge number of internal voltages and reading operations (with the above mentioned problems).

In addition, if at the end of the erasing loop too many depleted transistors are connected to the same bit line, their restoring is very difficult (if not impossible). In fact, the unselected depleted transistors shunt part of the current needed for programming the selected depleted transistor.

A solution proposed in the art for alleviating this drawback consists in biasing the unselected transistors to a negative voltage, so as to ensure that all the unselected transistors are not conductive, even if they are depleted. However, this makes the restoring of the depleted transistors quite different from a standard programming operation, requiring the management of voltages with opposed sign at the same time.

SUMMARY OF THE INVENTION

It is an object of the present invention to overcome at least the above-mentioned drawbacks.

Briefly, the present invention provides a method of erasing a flash memory integrated in a chip of semiconductor material and comprising at least one matrix of cells with a plurality of rows and a plurality if columns made in at least one insulated body, the cells of each row being connected to a corresponding work line. The method includes the step of applying a single erasing pulse relative to a selected single one of the at least one body to a selected subset of the word lines for erasing the cells of each corresponding row made in the selected body with no intermediate check of the completion of the erasure.

Moreover, the present invention also provides a corresponding flash memory.

BRIEF DESCRIPTION OF THE DRAWINGS

Further features and the advantages of the solution according to the present invention will be made clear by the following description of a preferred embodiment thereof, given purely by way of a non-restrictive indication, with reference to the attached figures, in which.

DETAILED DESCRIPTION OF THE PREFERRED EMBODIMENTS

Figure 1A:
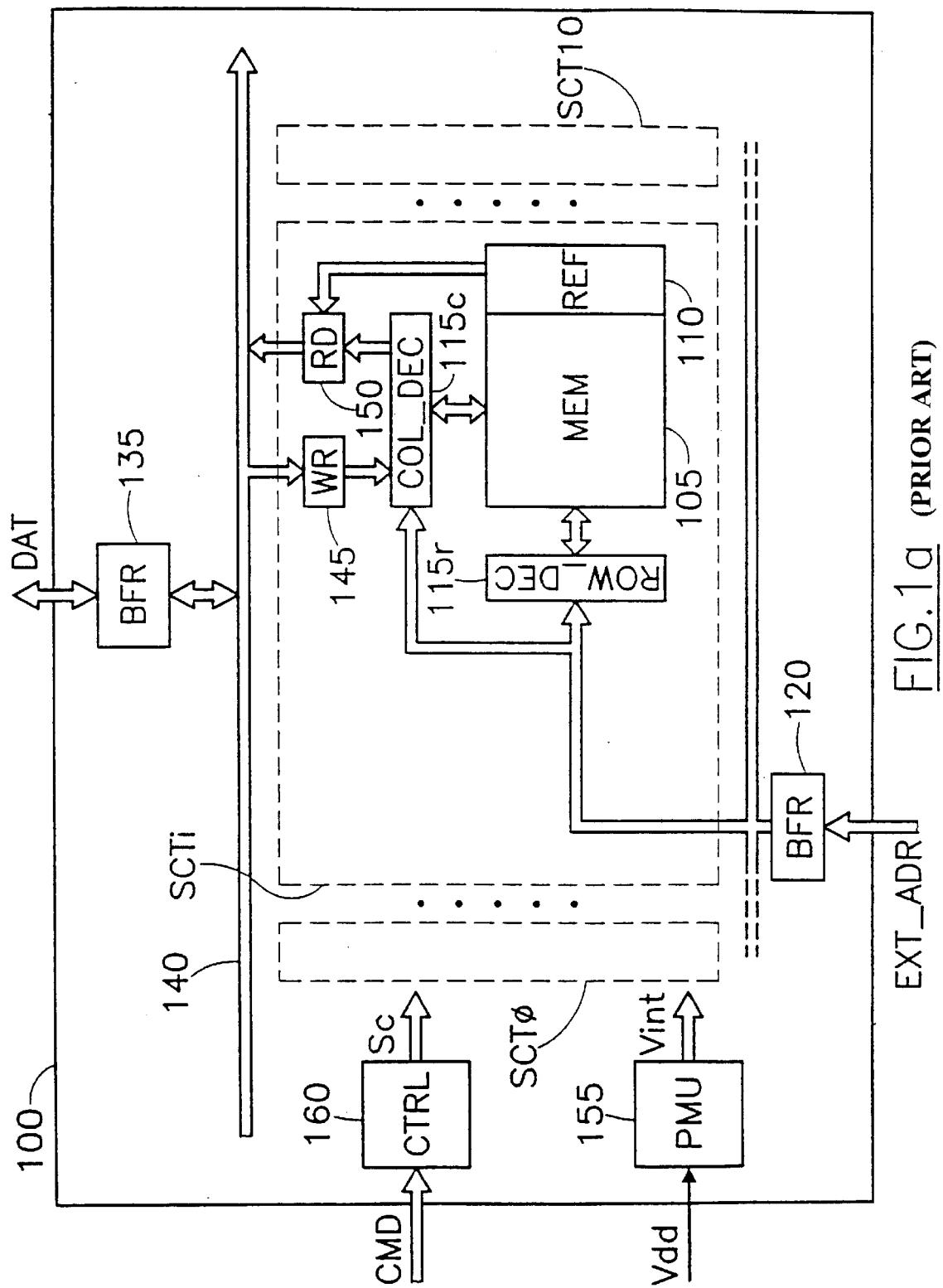
FIG. 1a is a schematic block diagram of a flash memory in which the method of the invention can be used.

With reference in particular to FIG. 1a, there is shown a flash memory 100 with a structure well known in the art. The flash memory 100 is integrated in a chip of semiconductor material and it is segmented into a plurality of sectors SCTi (for example eleven sectors, with i=0 . . . 10); a generic sector SCTi includes a matrix (MEM) 105 of memory cells, with a respective array (REF) 110 of reference cells. Typically, the flash memory 100 has an asymmetric architecture, wherein a first sector has a reduced capacity in comparison with the other sectors, for example 8 K bytes (for storing boot code) and 64 K bytes (for storing data), respectively.

As described in detail in the following, the matrix 105 has a plurality of rows and a plurality of columns (512 rows× 1024 columns for a data sector of the example at issue). A column decoder (COL_DEC) 115c and a row decoder (ROW_DEC) 115r are used to select the columns and the rows, respectively, of the matrix 105.

An external address (EXT_ADR) is latched in a buffer (BFR) 120. A first portion of the external address EXT_ADR is supplied to the column decoder 115c, and a second portion of the external address EXT_ADR is supplied to the row decoder 115r. A block of data (DAT) read from or to be written onto the matrix 105 is latched in a further buffer (BFR) 135, which is connected to an internal data bus 140. A writing unit (WR) 145 receives the block of data to be written onto the matrix 105 from the bus 140, and drives the column decoder 115c accordingly. The column decoder 115c and the reference array 110 are connected to respective inputs of a reading unit (RD) 150, which sends the block of data read from the matrix 105 onto the bus 140.

A power management unit (PMU) 155 receives an external power supply voltage Vdd, for example 3V relative to a reference voltage (or ground). The power management unit 115 generates a plurality of internal supply voltages (denoted as a whole with Vint) by means of respective charge pumps. The operation of the flash memory 100 is controlled by a state machine (CTRL) 160, which outputs a plurality of control signals (denoted as a whole with 5c) in response to external command signals (denoted as a whole with CMD).

Similar considerations apply if the flash memory has a different structure and capacity (for example with the reference cells replaced by corresponding reference circuits), if the flash memory includes a different number of sectors, if the flash memory has a bulk erase architecture (with a single matrix of memory cells), if the sectors are uniform, and the like.

Figure 1B:
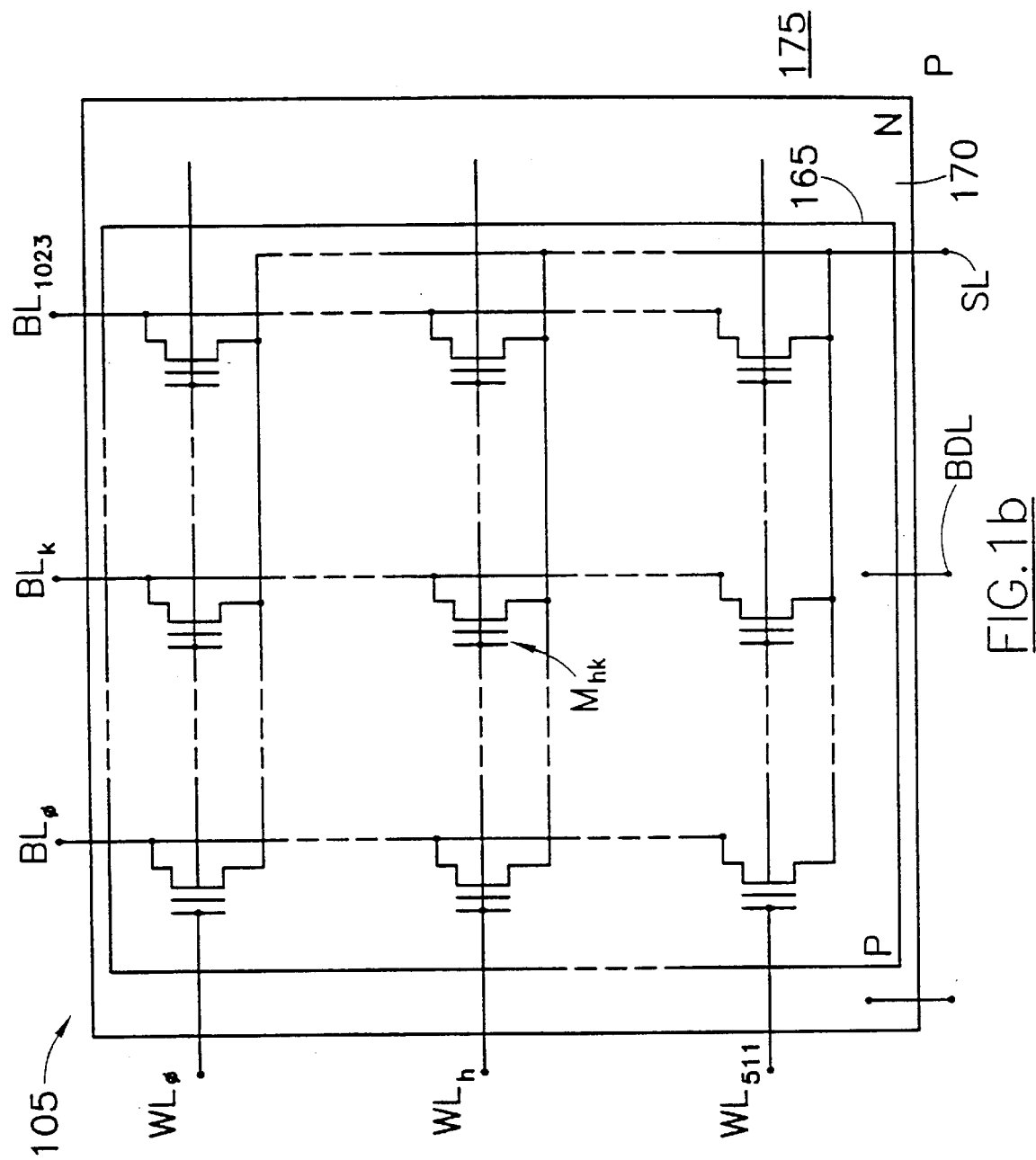
FIG. 1b is a schematic diagram of a sector of the flash memory.

As shown in FIG. 1b, the matrix 105 is made in a well of semiconductor material 165 (body or bulk) with a given type of conductivity (for example a P-well). The body 165 is in turn formed in a further well 170 of the opposite type of conductivity (N), so as to be insulated from a semiconductor substrate 175 of the P type.

The matrix 105 has a so-called NOR architecture, wherein the memory cells of each column are parallel connected to each other. Particularly, each memory cell consists of a FAMOS (Floating-gate, Avalanche-injection MOS transistor) Mhk (with h=0 . . . 511 and k=0 . . . 1023 in the example at issue). The transistors Mhk of each row have a control gate terminal connected to a respective word line WLh (coupled to the row decoder); the transistors Mhk of each column have a drain terminal connected to a respective bit line BLk (coupled to the column decoder). All the transistors Mhk of the matrix 105 have a source terminal connected to a common source line SL. A body line BDL is used to contact the body 165.

The transistor Mhk includes a floating gate, which is electrically insulated from the semiconductor material by a thin oxide layer. The transistor Mhk in a not-programmed (or erased) condition has a low threshold voltage. Therefore, when the transistor Mhk is selected and biased for reading, a current flows through the respective bit line BLk, so that a first logic value (1) is detected by the reading unit (comparing the current on the bit line with a current supplied by a corresponding reference cell).

As described in detail in the following, the transistor Mhk is programmed by applying a high (positive) biasing voltage to the gate terminal with respect to the body and the source terminal; this voltage supplies sufficient energy to some of the electrons (hot electrons) flowing through a channel of the transistor Mhk to cause them to be injected into the floating gate. The charge transferred into the floating gate is retained for any practical time period. As a consequence, the transistor Mhk in a programmed condition has a high threshold voltage; in this way, when the programmed transistor Mhk is selected and biased for reading, no current flows through the respective bit line BLk, so that a second logic value (0) is detected by the reading unit.

The programmed transistor Mhk is erased by discharging its floating gate. Particularly, a high (negative) biasing voltage is applied to the gate terminal with respect to the body and the source terminal; this voltage generates a low Fowler-Nordheim current by quantum-mechanical tunnelling (flowing between the floating gate and the body and source terminal), which removes the charge from the floating gate of the transistor Mhk.

Similar considerations apply if the matrix has a different structure (for example with a NAND architecture), if the P-type regions are replaced by N-type regions and vice-versa, if the memory cells are formed by different elements (for example programmed by tunneling), and the like.

Figure 2A:
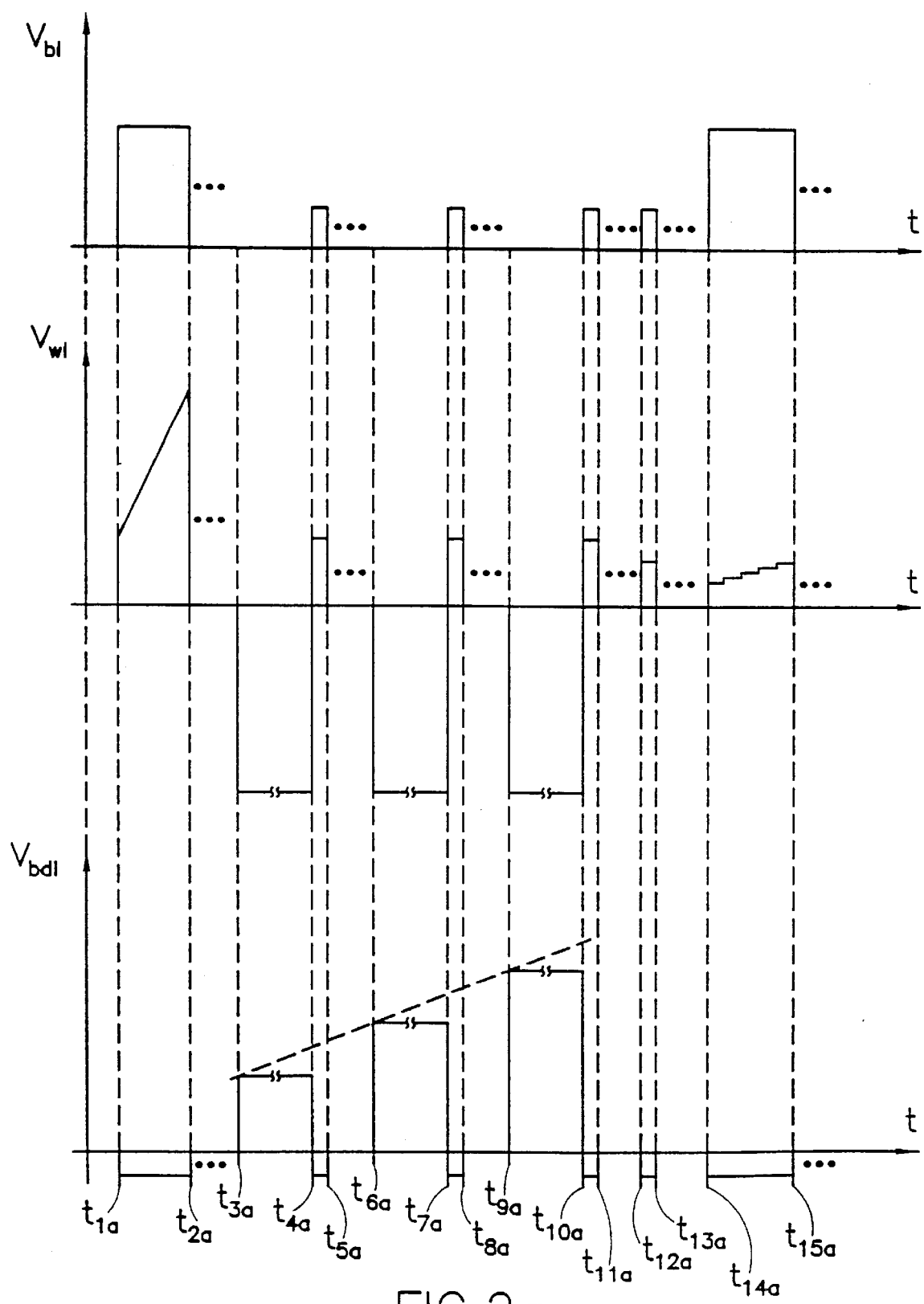
FIGS. 2a and 2b are qualitative timing diagrams of a method of erasing the flash memory according to the prior art and to the present invention, respectively.

An erasing procedure of the flash memory described above is carried out in the prior art by selecting all the transistors of a sector. With reference to FIG. 2a, which shows the variation with time (t) of the voltage on a generic bit line (Vbl), on a generic word line (Vwl) and on the body line (Vbdl), the transistors of every byte (eight bit lines) in every word line are at first pre-programmed to the logic value 0. In this way, substantially the same charge flows through the oxide layer of all the transistors during the life of the flash memory; this ensures a uniform degradation of the transistors with time, and then a reduced spread of their threshold voltages.

More specifically, during a period from the time t1a to the time t2a (taking about 5 µs), the bit lines of a current byte are biased to a voltage of 4.5V, while the other bit lines are left floating. The body line is biased to a voltage of −1.2V, while the N-well is biased to a voltage of 3V (for reverse biasing of a PN junction formed between them); the common source line (not shown in the figure) is kept at the reference voltage (0V). A programming pulse with a trapezoidal shape varying from a voltage of 3V (time t1a) to a voltage of 8.5V (time t2a) is applied to a current word line, while the other word lines are kept at the reference voltage. In this way, only the transistors of the current byte in the current word line are subjected to a biasing condition suitable for injecting charges into their floating gates; moreover, the shape of the programming pulse ensures that the electric field at the oxide layer is kept substantially constant while the charge in the floating gate increases. The same step (period t1a–t2a) is repeated for each byte and word line of the sector.

All the transistors of the sector are then erased at the same time. Particularly, during a period from the time t3a to the time t4a (taking about 10–50 ms) the bit lines of the sector are left floating; the word lines of the sector are biased to a voltage of −8V. A first (square-shaped) erasing pulse with a value of 3V is applied to the body line and to the common source line, while the N-well is biased to a voltage of 8.5V. In this way, all the transistors of the sector are subjected to a biasing condition suitable for removing charges from their floating gates.

The transistors of every byte in every word line are then checked in order to verify the completion of the erasing procedure. More specifically, during a next period from the time t4a to the time t5a (taking about 50–100 ns), the bit lines of a current byte are biased to a voltage of 1V, while the other bit lines are left floating. The body line is biased to a voltage of −1.2V, while the N-well and the common source line are kept at the reference voltage. A current word line is biased to a voltage of 3V, while the other word lines are biased to a voltage of −2V (for ensuring that the corresponding transistors are not conductive, even if they are depleted). The current flowing through each transistor of the current byte in the current word line is compared with a current supplied by a corresponding reference cell, in order to verify if the threshold voltages of the transistors have fallen below a pre-set value slightly lower than a reading threshold value (typically 2.5V and 3V, respectively). The same step (period t4a–t5a) is repeated for each byte and word line of the sector.

If not all the transistors of the sector have been erased, the steps described above (period t3a–t5a) are repeated increasing the value of the erasing pulse (voltage on the body and common source lines), in order to approximate a trapezoidal wave shape providing a constant electric field at the oxide layer (periods t6a–t8a and t9a–t11a). If all the transistors are not erased before the erasing pulse reaches a pre-set maximum value (8.5V in the example at issue), or after a further number of erasing pulses at the maximum value, the erasing procedure is aborted and the flash memory enters an error condition.

If the sector is successfully erased, the transistors of every byte in every word line are checked in order to verify if they have been over-erased, and therefore feature a negative threshold voltage (depleted transistors). During a period from the time t12a to the time t13a the bit lines of a current byte are biased to a voltage of 1V, while the other bit lines are left floating. The body line is biased to a voltage of −1.2V, while the N-well and the common source line are kept at the reference voltage. A current word line is biased to a voltage of 2V, while the other word lines are biased to a voltage of −2V. The current flowing through each transistor of the current byte in the current word line is compared with a current supplied by a corresponding reference cell, in order to verify if the threshold voltage of the transistor is fallen below a pre-set value (typically 0V).

The depleted transistors are restored to a not-depleted condition by a (soft) programming operation, which raises the threshold voltage of the depleted transistors above the aforementioned pre-set value (0V), while maintaining their logic value 1. Particularly, during a period from the time t14a to the time t15a the bit lines of the current byte corresponding to the depleted transistors are biased to a voltage of 4.5V, while the other bit lines are left floating. The body line is biased to a voltage of −1.2V, while the N-well is biased to a voltage of 3V; the common source line is kept at the reference voltage. A series of low value programming pulses, varying from a voltage of 1.5V (time t14a) to a voltage of 3V (time t15a), is applied to the current word line (while the other word lines are kept at the reference voltage); the programming pulses have an increasing value, with each erasing pulse followed by a check of the completion of the restoring (schematically shown in the figure with a staircase-like shape). The same steps (period t12a–t15a) are repeated for each byte and word line of the sector.

The depleted transistors are restored to a not-depleted condition by a (soft) programming operation, which raises the threshold voltage of the depleted transistors above the aforementioned pre-set value (0V), while maintaining their logic value 1. Particularly, during a period from the time t14a to the time t15a the bit lines of the current byte corresponding to the depleted transistors are biased to a voltage of 4.5V, while the other bit lines are left floating. The body line is biased to a voltage of −1.2V, while the N-well is biased to a voltage of 3V; the common source line is kept at the reference voltage. A series of low value programming pulses, varying from a voltage of 1.5V (time t14a) to a voltage of 3V (time t15a), is applied to the current word line (while the other word lines are kept at the reference voltage); the programming pulses have an increasing value, with each erasing pulse followed by a check of the completion of the restoring (schematically shown in the figure with a staircase-like shape). The same steps (period t12a–t15a) are repeated for each byte and word line of the sector.

Figure 2B:
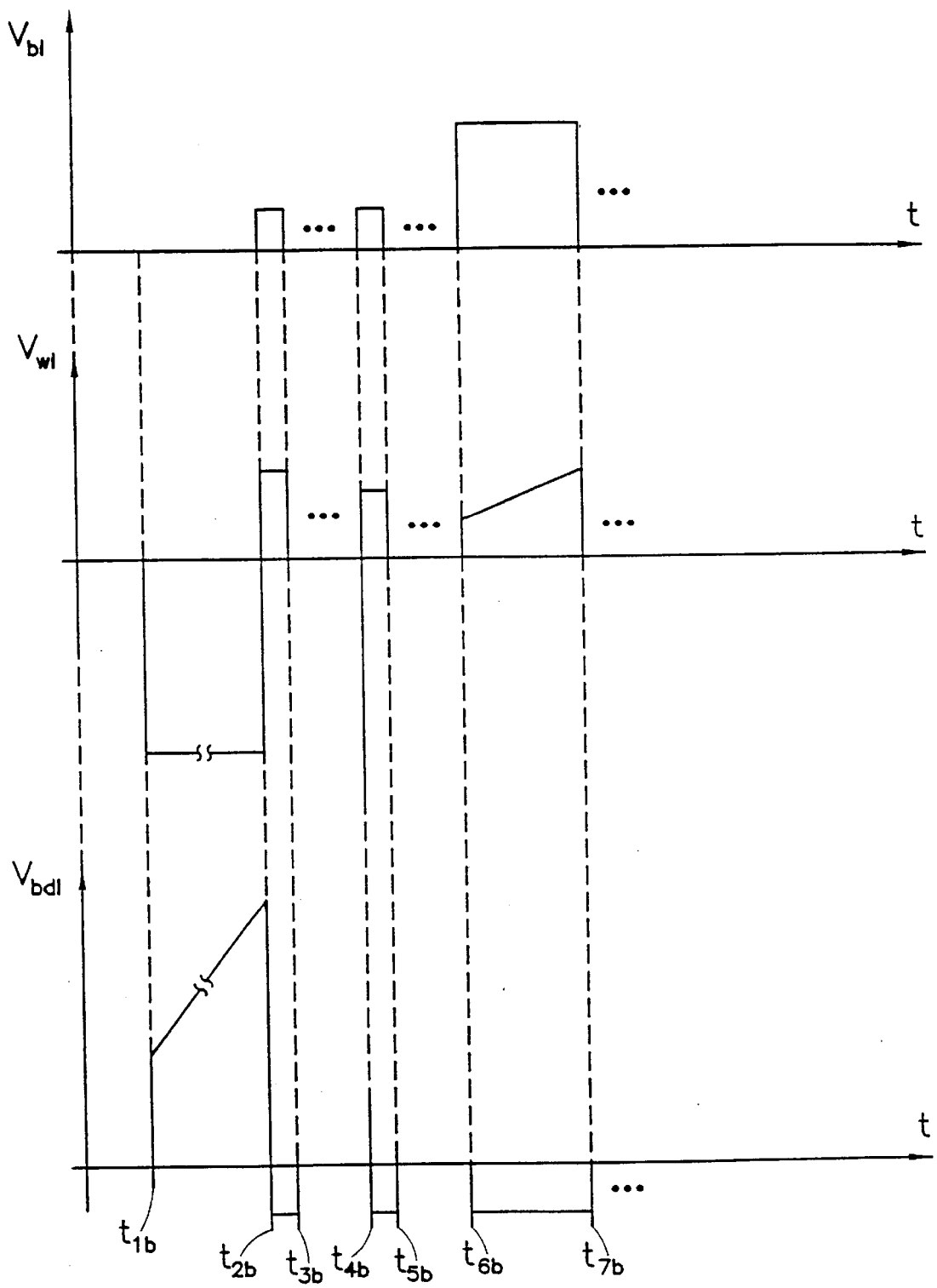

Conversely, in a first embodiment of the method according to the present invention shown in FIG. 2b, the erasing procedure is carried on a selected sub-set of the word lines at a time, which sub-set preferably consists of a single word line. Particularly, during a period from the time t1b to the time t2b (taking about 1–2 ms) the bit lines of the sector are left floating; a selected word line is biased to a voltage of −8V, while the other word lines are biased to a voltage of −2V. A single erasing pulse is applied to the body line and to the common source line, while the N-well is biased to a voltage of 8.5V (or anyway higher than the voltage on the body and common source lines at any time). The erasing pulse has a trapezoidal shape varying from a voltage of 3V (time t1b) to a voltage of 8.5V (time t2b), with no intermediate check of the result of the erasure (blind pulse).

The transistors of every byte in the current word line are then checked in order to verify the completion of the erasing procedure (period t2b–t3b for each byte of the current word line, corresponding to the period t10a–t11a of FIG. 2a). If all the transistors are not erased, the erasing procedure is aborted and the flash memory enters an error condition. Conversely, the transistors of every byte in the current word line are checked in order to verify if they are depleted (period t4b–t5b for each byte in the current word line, corresponding to the period t12a–t13a of FIG. 2a), and the depleted transistors are soft-programmed to the not-depleted condition (period t6b–t7b for each byte in the current word line, corresponding to the period t14a–t15a of FIG. 2a).

The steps described above (period t1b–t7b) are repeated for every word line of the sector, in order to erase all the transistors of the sector.

Figure 3A:
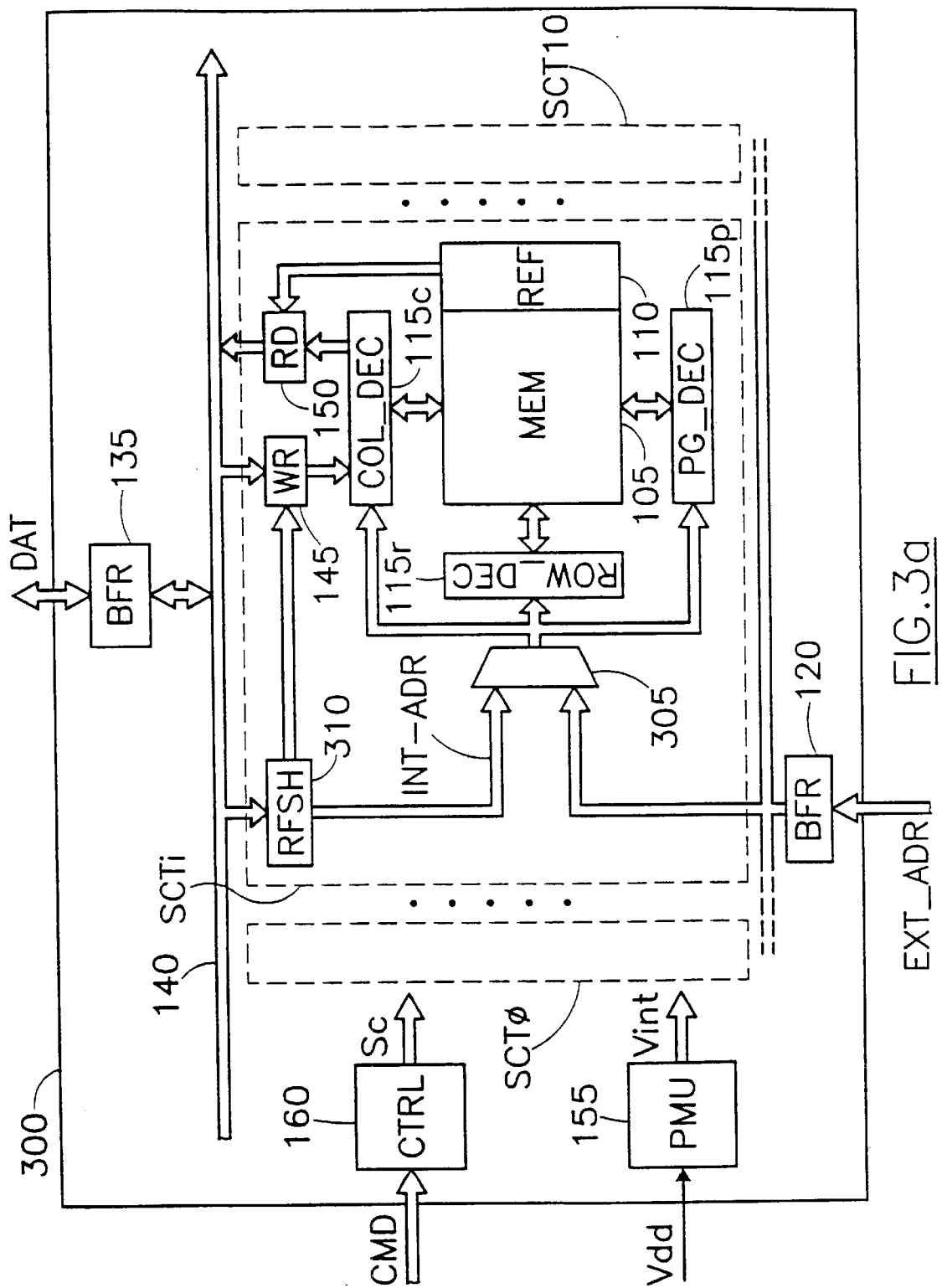
FIGS. 3a and 3b are schematic block diagrams of a flash memory with a different architecture and a sector thereof, respectively.
Figure 3B:
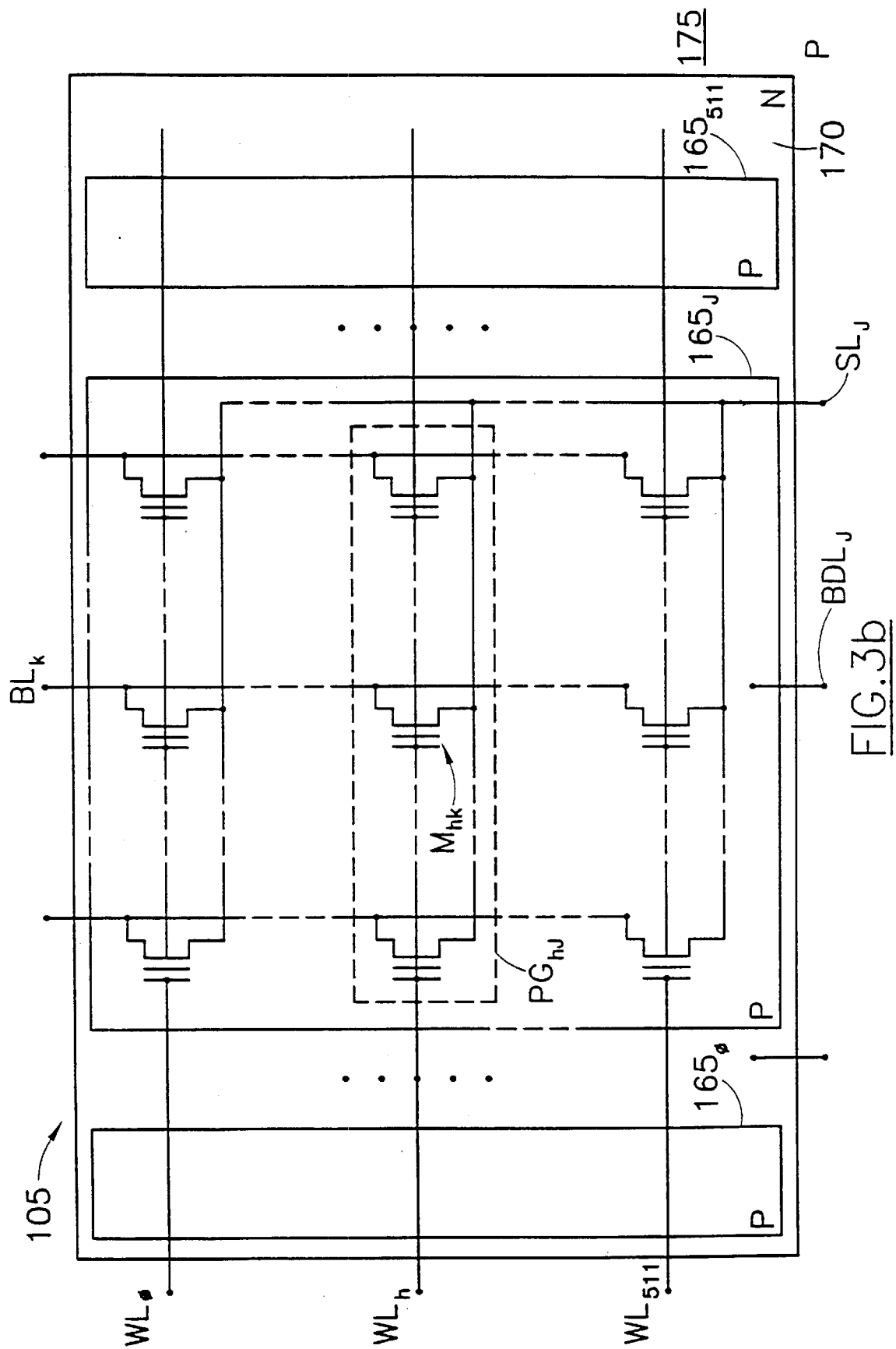

With reference now to FIGS. 3a and 3b (the elements corresponding to the ones shown in the FIGS. 1a and 1b are denoted with the same references, and their explanation is omitted for the sake of simplicity), the method according to the present invention is preferably implemented in a flash memory 300 (FIG. 3a) with a higher resolution. As described in detail in the following, the columns of each sector SCTi are grouped in sets, for example 32 sets each one consisting of 32 columns; the transistors of each word line belonging to the same set define a page. The sector SCTi further includes a page decoder (PG_DEC) 115p, which is used to select the sets (and then the pages) of the matrix 105.

The external address EXT_ADR latched in the buffer 120 is provided to a first input of a multiplexer 305; a second input of the multiplexer 305 receives an internal address (INT_ADR) from a refreshing unit (RFSH) 310. The multiplexer 305 selectively transmits the external address EXT_ADR or the internal address INT_ADR; a first portion of the transmitted address (EXT_ADR or INT_ADR) is supplied to the column decoder 115c, a second portion of the transmitted address is supplied to the row decoder 115r, and a third portion of the transmitted address is supplied to the page decoder 115p. The refreshing unit 310 is further connected to the bus 140 (for receiving the block of data read from the matrix 105) and to the writing unit 145 (for supplying the block of data to be written onto the matrix 105).

Considering now FIG. 3b, the pages PGhj of each set (with j=0 . . . 511 in the example at issue) are made in a respective insulated body (P-well) 165j inside the N-well 170. The bodies 165j are strip-shaped and extend transversally relative to the word lines WLh (particularly in the direction of the bit lines BLk). A distinct source line SLj is provided for each body 165j. A distinct body line BDLj is used to connect each body 165j individually to the page decoder.

Similar considerations apply if the columns are grouped in a different number of sets, if the bodies have a different shape, and so on.

Figure 4:
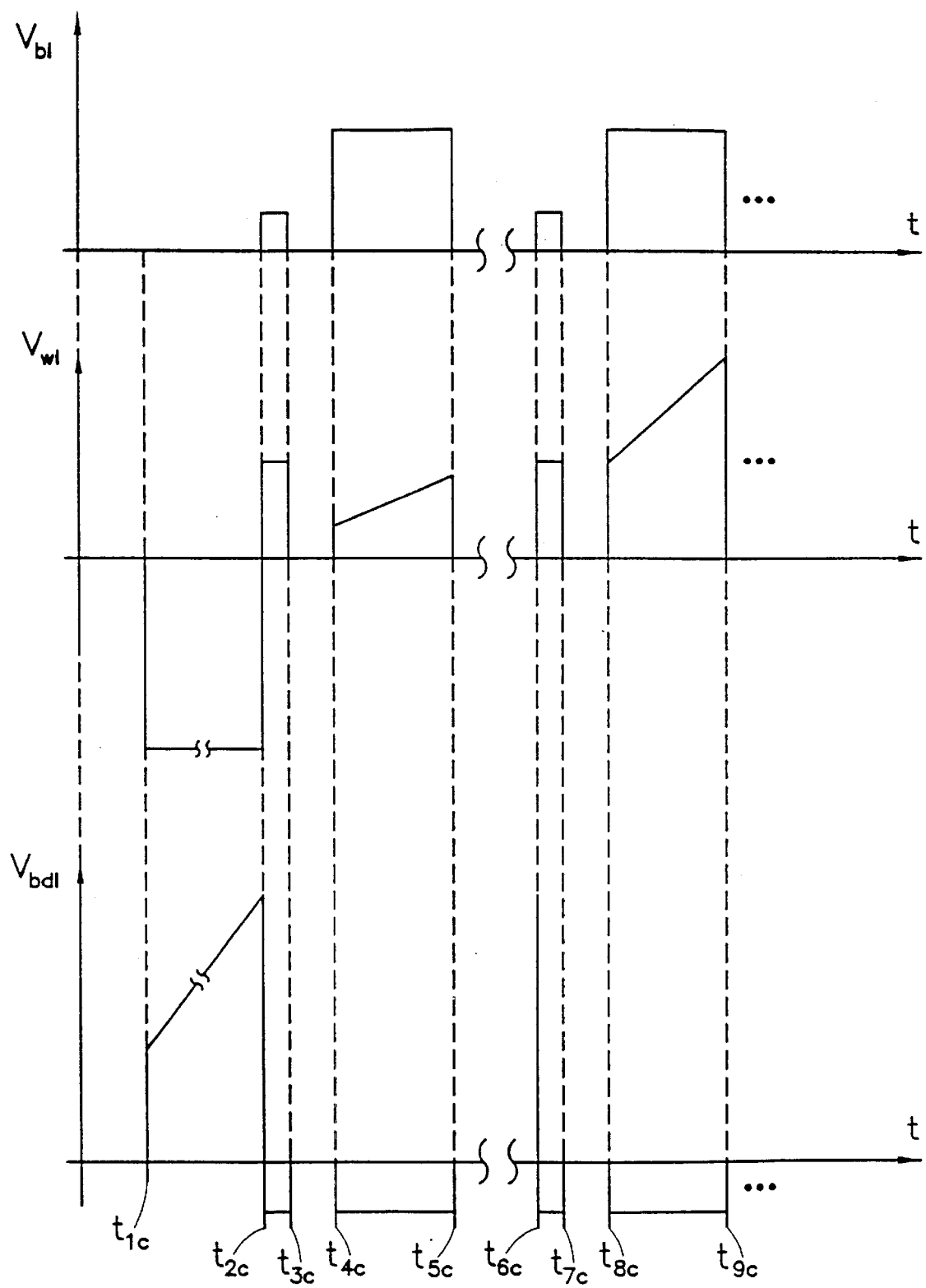
FIG. 4 is a schematic diagram of a method of erasing the flash memory of FIGS. 3a and 3b.

In the flash memory described above, the erasing procedure is carried out on a selected sub-set of the pages at a time, which sub-set preferably consists of a single page. With reference to FIG. 4, which shows the variation with time (t) of the voltage on a generic bit line (Vbl), on a generic word line (Vwl) and on a generic body line (Vbdl), during a period from the time t1c to the time t2c (taking about 1–2 ms), the bit lines of the sector are left floating. The word line of a selected page is biased to a voltage of –8V, while the other word lines are biased to a voltage of –2V. A single erasing pulse having a trapezoidal shape varying from a voltage of 3V (time t1c) to a voltage of 8.5V (time t2c), with no intermediate check of the completion of the erasure, is applied to the body line and to the common source line of the selected page, while the other body lines and common source lines are kept at the reference voltage (or are biased to a noise-inhibition voltage of 2V); the N-well is biased to a voltage at least equal to 8.5V (or anyway higher than the voltage on the body and common source lines of the selected page at any time). In this way, in spite of the fact that the entire word line of the selected page is biased to the voltage of –8.5V, only the transistors of the selected page (to the body and source lines of which the erasing pulse varying from 3V to 8.5V is applied) are subjected to a biasing condition suitable for removing charges from their floating gate.

The transistors of the selected page are then checked in order to verify the completion of the erasing procedure. Particularly, during a next period from the time t2c to the time t3c (taking about 50–100 ns), the bit lines of the selected page are biased to a voltage of 1V, while the other bit lines are left floating. The body line and the common source line of the selected page are biased to a voltage of –1.2V, while the other body lines and common source lines are kept at the reference voltage; the N-well is kept at the reference voltage. The word line of the selected page is biased to a voltage of 3V, while the other word lines are kept at the reference voltage. The current flowing through each transistor of the selected page is compared with a current supplied by a corresponding reference cell, in order to verify if the transistors have been erased.

If all the transistors are not erased, the erasing procedure is aborted and the flash memory enters an error condition. Conversely, all the transistors of the selected page are unconditionally soft-programmed to the not-depleted condition. Particularly, during a period from the time t4c to the time t5c the bit lines of the selected page are biased to a voltage of 4.5V (while the other bit lines are left floating). The body line of the selected page is biased to a voltage of –1.2V, while the other body lines are kept at the reference voltage; all the common source lines are kept at the reference voltage. The N-well is biased to a voltage of 3V. A single trapezoidal programming pulse varying from a voltage of 1.5V (time t4c) to a voltage of 3V (time t5c) is applied to the word line of the selected page, while the other word lines are kept at the reference voltage.

During the erasing procedure described above, the transistors that do not belong to the word line of the selected page but are formed in the same body are subjected to a body stress (being the body line biased up to a voltage of 8.5V). In a similar manner, the transistors that belong to the word line of the selected page but are formed in a different body are subjected to a gate stress (being the word line biased to a voltage of –8V). After repeated cycles of erasure of the memory, this may cause loss of the charge stored in the floating gate of the transistors, with an undesired erasure thereof. In order to prevent any loss of data stored in the memory, a refreshing procedure is preferably carried out periodically (after a pre-set number of erasing procedures, for example five).

The refreshing procedure starts with the step of reading with a margin the transistors of every page. Particularly, during a period from the time t6c to the time t7c, the bit lines of a current page are biased to a voltage of 1V while the other bit lines are left floating. The body line and the common source line of the current page are biased to a voltage of –1.2V, while the other body lines and common source lines are kept at the reference voltage; the N-well is kept at the reference voltage. The word line of the current page is biased to a voltage of 3V, while the other word lines are kept at the reference voltage. The current flowing through each transistor of the current page is compared with a current supplied by two corresponding different reference cells, in order to verify if the threshold voltage of the transistor is higher than the reading threshold (3V) and higher than a reading threshold with a margin (for example 4V) at the same time.

The transistors with the threshold voltage between the reading threshold and the reading threshold with a margin, that is the transistors in the programmed condition that are loosing their charge, are then re-programmed. During a period from the time t8c to the time t9c the bit lines of the current page corresponding to these transistors are biased to a voltage of 4.5V, while the other bit lines are left floating. The body line of the current page is biased to a voltage of –1.2V, while the other body lines are kept at the reference voltage; all the common source lines are kept at the reference voltage. The N-well is biased to a voltage of 3V. A single trapezoidal programming pulse varying from a voltage of 3V (time t8c) to a voltage of 8.5V (time t9c) is applied to the word line of the current page, while the other word lines are kept at the reference voltage.

The same steps (period t9c–t16c) are repeated for each page of the sector.

Similar considerations apply (to both the embodiments described above) if the erasing procedure has a different timing, if the erasing pulse is obtained by varying the voltage on the word line or on both the word line and the body line, if no check of the success of the erasing is performed, if different internal voltages are used (for example with the body lines distinct from the one of the current page biased to a negative voltage instead of to the reference voltage during the erasing procedure, in order to reduce the gate stress on the transistors), and so on.

More generally, the present invention provides a method of erasing a flash memory integrated in a chip of semiconductor material and comprising at least one matrix of cells with a plurality of rows and a plurality of columns made in at least one insulated body, the cells of each row being connected to a corresponding word line; the method includes the step of applying a single erasing pulse relative to a selected single one of the at least one body to a selected subset of the word lines for erasing the cells of each corresponding row made in the selected body with no intermediate check of the completion of the erasure.

The method according to the present invention is very simple and fast. Moreover, the removal of the intermediate reading operations (with the corresponding high current flowing through the channels of the transistors) provides very low power consumption, which is particularly advantageous in portable devices (even if other applications are not excluded).

The proposed solution simplifies the structure of the flash memory, since a reduced number of internal voltages are required.

Moreover, a few transistors (at most equal to the number of word lines included in the selected sub-set) may be depleted in each bit line after the erasing pulse (being the erasing pulse applied only to these word lines). Therefore, the depleted transistors can always be restored with a standard (soft) programming operation, without requiring any particular biasing of the unselected transistors.

The erasing pulse is set to ensure that all the transistors of the selected body and row are erased (considering the spread of conditions due to the manufacturing process and the aging of the flash memory). As a consequence, during the erasing procedure some electric charges always flow though the oxide layer of all the transistors (even if they are not programmed); this reduces the not-uniform degradation of the transistors with time, and allows the preliminary step of programming all the transistors to be avoided (even if the provision of this preliminary step is not excluded).

The particular embodiments of the present invention described above offer further advantages. For example, the erasing pulse is preferably applied to a single word line at a time. In this way, the flash memory can be erased a word line at a time; moreover, at most a single transistor may be depleted on each bit line after the erasing pulse. The erasing pulse with a trapezoidal shape provides an actual constant electric field at the oxide layer of the transistors to be erased, with an optimal operation of the flash memory. However, the method of the present invention leads itself to be implemented even applying the erasing pulse to two, three or more word lines at the same time, or with an erasing pulse of a different shape (for example a square-shaped pulse).

The solution of the invention is particularly advantageous in a flash memory with a high resolution. This architecture makes it possible to modify (erase and then program) a single page at a time. A further advantageous is that the erasing procedure always takes a pre-set time, which is known a priori and does not change with time (contrary to the methods known in the art wherein the length of the erasing procedure increases with the aging of the flash memory, because of the charges trapped into the oxide layer).

The erased transistors are unconditionally soft programmed to the not-depleted condition (without verfying if they are actually depleted); the operation is preferably carried out with a single (soft) programming pulse having a trapezoidal shape. This feature does not introduce any significant delay in the erasing procedure (being a few pages erased at a time), but further reduces the power consumption of the flash memory (due to the removal of the reading operation). It should be noted that the soft programming of any transistor that is not depleted has no consequence thereon (being the soft programming an operation that cannot cause a change of the logic value associate with the transistor).

Moreover, the refreshing procedure ensures that no loss of data is suffered with time (in the flash memory with a page architecture). Preferably, the refreshing procedure is carried out reading with a margin the cells and applying a single programming pulse having a trapezoidal shape to the read cells in the programmed condition.

Alternatively, different programming pulses are used both in the soft-programming operation and in the refreshing procedure, all the transistors in the programmed condition are always re-programmed, the refreshing procedure is carried out after a pre-set time or after each erasing procedure (in this case only for the transistors which do not belong to the current word line but which are formed in the same body of the current page, and for the transistors which are not formed in the same body of the current page but which belong to the current word line), and the like.

However, the method of the invention leads itself to be carried out even in a flash memory with a different architecture (for example with the whole sector formed in a single body, but with the erasing procedure carried out a word line at a time), with the step of checking the erased transistors and soft programming only the depleted ones, and without any refreshing procedure.

The method of the invention is also suitable to be implemented in a flash memory with a standard architecture, which is erased iterating the same operations for each word line. In order to obtain a speed of the erasing procedure comparable with the one of the prior art (in which the whole sector is erased at the same time), it is enough to increase the electric field applied to the transistors and then the respective Fowler-Nordheim current. It should be noted that this increase is possible with the solution of the invention because it provides a better controlled electric field at the oxide layer of the transistors. Moreover, in this case no refreshing procedure is required, since all the transistors of the sector must be erased.

Naturally, in order to satisfy local and specific requirements, a person skilled in the art may apply to the solution described above many modifications and alterations all of which, however, are included within the scope of protection of the invention as defined by the following claims.

What is claimed is:

1. A method of erasing a flash memory comprising a semiconductor substrate having at least one well therein, at least one matrix of memory cells in a plurality of rows and a plurality of columns in the at least one well, and a plurality of word lines connected to the memory cells such that each memory cell in a row connects to a corresponding word line, the method comprising:

applying a single erasing pulse to a selected well and at least one selected word line to thereby erase each memory cell connected thereto and without an intermediate check of completion of erasure;

the at least one selected word line comprising a selected subset of the plurality of word lines.

2. A method according to claim 1 wherein the selected subset of word lines is a single word line.

3. A method according to claim 1 wherein the single erasing pulse has a trapezoidal shape.

4. A method according to claim 1 wherein the at least one well comprises a plurality of wells.

5. A method according to claim 4 further comprising unconditionally programming all the erased memory cells to a not-depleted condition.

6. A method according to claim 5 wherein unconditionally programming comprises applying a single soft-programming pulse having a trapezoidal shape.

7. A method according to claim 6 further comprising refreshing the memory cells.

8. A method according to claim 7 wherein refreshing comprises reading at least one marginal memory cell and applying a single programming pulse having a trapezoidal shape to at least one read marginal memory cell in a programmed condition.

9. A method according to claim 1 wherein the at least one well comprises a single well, and further comprising applying in succession a single erasing pulse to each subset of word lines.

10. A method of erasing a flash memory comprising a semiconductor substrate having at least one well therein, at least one matrix of memory cells in a plurality of rows and a plurality of columns in the at least one well, and a plurality of word lines connected to the memory cells such that each memory cell in a row connects to a corresponding word line, the method comprising:

applying a single erasing pulse to a selected well and at least one selected word line to thereby erase each memory cell connected thereto and without an intermediate check of completion of erasure;

the at least one selected word line comprising a selected subset of the plurality of word lines; and unconditionally programming all erased memory cells to a not-depleted condition by applying a single soft-programming pulse.

11. A method according to claim 10 wherein the selected subset of word lines is a single word line.

12. A method according to claim 10 wherein the single erasing pulse has a trapezoidal shape.

13. A method according to claim 10 wherein the at least one well comprises a plurality of wells.

14. A method according to claim 10 wherein the at least one well comprises a single well, and further comprising applying in succession a single erasing pulse to each subset of word lines.

15. A method according to claim 14 further comprising refreshing the memory cells.

16. A method according to claim 15 wherein refreshing comprises reading at least one marginal memory cell and applying a single programming pulse having a trapezoidal shape to at least one read marginal memory cell in a programmed condition.

17. A flash memory comprising:

a semiconductor substrate having at least one well therein;

at least one matrix of memory cells in a plurality of rows and a plurality of columns in said at least one well; and a plurality of word lines connected to said memory cells such that each memory cell in a row connects to a corresponding word line;

each memory cell being erasable with a single erasing pulse applied to a selected well and to at least one selected word line to thereby erase each memory cell connected thereto without an intermediate check of erasure;

said at least one selected word line comprising a selected subset of the plurality of word lines.

18. A flash memory according to claim 17 wherein said selected subset of word lines is a single word line.

19. A flash memory according to claim 17 wherein said at least one well comprises a plurality of wells.

20. A flash memory according to claim 17 wherein said memory cells are erasable with an erasing pulse having a trapezoidal shape.

21. A flash memory according to claim 20 wherein each erased memory cell can be unconditionally programmed to a not-depleted condition.

22. A flash memory according to claim 21 wherein each erased memory cell can be unconditionally programmed with a single soft-programming pulse.

* * * * *